(12) United States Patent
Helfmeier et al.

(10) Patent No.: US 9,945,891 B2
(45) Date of Patent: Apr. 17, 2018

(54) CHARGE MEASURING DEVICE WITH INTEGRATED FET, CAPACITOR, AND CHARGE ACCUMULATION DEVICE

(71) Applicant: TECHNISCHE UNIVERSITAET BERLIN, Berlin (DE)

(72) Inventors: Clemens Helfmeier, Berlin (DE); Christian Boit, Berlin (DE); Uwe Kerst, Berlin (DE)

(73) Assignee: Technische Universitaet Berlin, Berlin (DE)

( * ) Notice: Subject to any disclaimer, the term of this patent is extended or adjusted under 35 U.S.C. 154(b) by 332 days.

(21) Appl. No.: 14/370,805

(22) PCT Filed: Jan. 4, 2013

(86) PCT No.: PCT/EP2013/050102
§ 371 (c)(1),
(2) Date: Jul. 7, 2014

(87) PCT Pub. No.: WO2013/102660
PCT Pub. Date: Jul. 11, 2013

(65) Prior Publication Data
US 2014/0375303 A1    Dec. 25, 2014

(30) Foreign Application Priority Data

Jan. 6, 2012   (DE) .................. 10 2012 200 168

(51) Int. Cl.
*G01R 17/16*   (2006.01)
*G01R 29/24*   (2006.01)
(Continued)

(52) U.S. Cl.
CPC .............. *G01R 29/24* (2013.01); *G11C 16/22* (2013.01); *G01R 31/2884* (2013.01)

(58) Field of Classification Search
CPC ........... G01N 27/4148; G01N 27/4145; G01N 27/414; G01N 27/27; G01N 33/54373;
(Continued)

(56) References Cited

U.S. PATENT DOCUMENTS 5,168,174 A  * 12/1992 Naso .................. H02M 3/07
327/536
6,452,283 B2    9/2002 Smola et al.
(Continued)

FOREIGN PATENT DOCUMENTS

DE       10111027 C1   8/2002
DE       10154392 A1   5/2003
(Continued)

OTHER PUBLICATIONS

Norimatsu, H., "High speed measurement of FET Vth at low Id", Microelectronic Test Structures, ICMTS 1989. Proceedings of the 1989 International Confrerence, vol. 2, Mar. 1989, pp. 31-34.

*Primary Examiner* — Vinh Nguyen
(74) *Attorney, Agent, or Firm* — Laurence A. Greenberg; Werner H. Stemer; Ralph E. Locher

(57) ABSTRACT

A charge measuring device detects focused ion beam attacks on an integrated semiconductor circuit with a capacitor, a field effect transistor, and a charge collecting device all manufactured in the integrated semiconductor circuit and insulated from additional circuit elements. A first pole of the capacitor is conductively connected to the charge collecting device and a gate of the field effect transistor. When a voltage is applied to the second pole of the capacitor, a drain source current flows through the field effect transistor, and a relationship between the voltage and the drain source current is ascertained. A comparison of the relationship with a
(Continued)

previously ascertained relationship indicates a change of the charge quantity stored in the capacitor by the charge collecting device.

10 Claims, 4 Drawing Sheets

(51) Int. Cl.
  *G11C 16/22* (2006.01)
  *G01R 31/28* (2006.01)
(58) Field of Classification Search
  CPC ...... G01N 27/4143; H01L 2924/19041; H01L 2924/19042; H01L 2924/19043; H01L 2924/30105; H01L 2924/3011; H01L 2924/3025; H01L 27/1255; G06K 19/06; G01T 1/24; H03K 17/687; H03K 2217/0018; H02J 7/0052; H02J 7/345; G01R 27/26; G01R 23/09; G01R 29/24; G01R 31/3624; H01G 7/00; H03J 2200/10; H03M 1/804; H03F 1/342; H03F 3/195; H03F 3/4547
  See application file for complete search history.

(56) References Cited

U.S. PATENT DOCUMENTS

| | | | |
|---|---|---|---|
| 6,747,303 B2 | 6/2004 | Schroeder | |
| 6,964,378 B2* | 11/2005 | Taddiken | G11C 16/22 235/451 |
| 8,320,176 B2 | 11/2012 | La Rosa | |
| 8,411,504 B2 | 4/2013 | Modave et al. | |
| 2002/0149416 A1* | 10/2002 | Bandy | G06K 7/0008 327/536 |
| 2006/0166438 A1* | 7/2006 | Servalli | H01L 27/115 438/257 |

FOREIGN PATENT DOCUMENTS

| | | |
|---|---|---|
| WO | 0011719 A1 | 3/2000 |
| WO | 02071485 A2 | 9/2002 |
| WO | 2008012464 A2 | 1/2008 |
| WO | 2008084017 A1 | 7/2008 |

\* cited by examiner

CHARGE MEASURING DEVICE WITH INTEGRATED FET, CAPACITOR, AND CHARGE ACCUMULATION DEVICE

BACKGROUND OF THE INVENTION

Field of the Invention

The invention relates to an apparatus for measuring small charge quantities and to a corresponding measurement method. In addition, the invention relates to the use of such a charge measuring device and such a measurement method for identifying an effect on an integrated semiconductor circuit with a beam of charged particles or an electrical field with a high field strength. In particular, such an apparatus can be used for identifying a so-called focused ion beam attack (FIB attack, for short).

The precise measurement of very small charge quantities is of particular importance for different applications, in particular in the research sector, for example in fundamental research, of the semiconductor industry and the like. Furthermore, the measurement of charges plays an important role in the identification of an attack on a semiconductor circuit which is believed to be being explored or manipulated by means of an FIB attack, for example. The ions impinging in the process on a semiconductor circuit transmit charge to the integrated semiconductor circuit, and this charge can be measured easily at least during the attack which is taking place.

Since it has become conventional to store security-relevant and sensitive data, for example bank data, access information, personal information, cryptographic keys, etc. in microchips which are integrated semiconductor circuits, there is also increasing interest in exploring or manipulating the information stored in such microchips. Sometimes, this information can also be read or manipulated from a microchip which is not in operation. However, at least manipulations on such a microchip can be performed via an FIB attack which make possible, or at least facilitate, an exploration when the microchip is subsequently used. Therefore, it is of interest to be able to determine from an integrated semiconductor circuit whether said integrated semiconductor circuit was or has been subjected to an FIB attack.

Sometimes, the sensitive data are stored in such a microchip only in cryptographically encrypted information. In order to be able to use this information for proper use, however, these data are generally decrypted during this proper use in the integrated semiconductor circuit. In the event of an FIB attack beginning at a suitable point, it is therefore possible to explore the decrypted data during operation of some integrated semiconductor circuits.

U.S. Pat. No. 6,964,378 B2 discloses an actuation circuit which is capable of actuating capacitively a storage cell via a capacitance. The capacitance is provided as additional circuit element and insulates an antenna from the actuation circuit of the storage cell. During an FIB attack, charge is accumulated on the antenna. The capacitance prevents the charge from flowing away, with the result that a voltage is generated which acts on the storage cell, which therefore experiences a change in the corresponding state of charge, which can in turn be measured. The described storage cell is preferably in the form of a so-called floating-gate cell, EEPROM (EEPROM=electrically erasable programmable read only memory) cell or flash cell. This apparatus known from U.S. Pat. No. 6,964,378 B2 therefore makes it possible to verify that an FIB attack has taken place.

BRIEF SUMMARY OF THE INVENTION

The invention is therefore based on the technical problem of providing an improved device for measuring charges and for detecting an FIB attack or another effect of a beam of charged particles or an electrical field with a high field strength on an integrated semiconductor circuit as well as a corresponding measurement method and a use.

The technical problem is solved according to the invention by a measuring device as claimed, a measurement method as claimed and a use as claimed. Advantageous configurations of the invention result from the dependent claims.

The invention is based on the concept of integrating a field-effect transistor, a capacitor with one pole and a further pole and a charge accumulation device in an integrated semiconductor circuit, wherein the charge accumulation device, one pole of the capacitor and the gate connection of the field-effect transistor are conductively connected to one another and are insulated as well as possible from further circuit components of the integrated semiconductor circuit. If the integrated semiconductor circuit is subjected to an FIB attack, for example, as a result charges accumulate on the capacitor via the charge accumulation device. The charge stored on the capacitor changes the relationship between a voltage acting as "gate voltage", which is connected to the further pole of the capacitor, and the drain-source current which is set in the field-effect transistor, whose gate is connected to one pole of the capacitor on which the charge is stored. Since the charge is stored in the capacitor and cannot flow away owing to the insulation, a charge measuring device designed in this way can be used to determine an FIB attack even retrospectively via the charge stored in the capacitor. The voltage which needs to be applied at the further pole of the capacitor, which is not conductively connected to the gate, in order to obtain a preset drain-source current under given operating conditions is thus dependent on the charge quantity stored in the capacitor. An integrated semiconductor circuit which is designed as described and comprises a capacitor which is conductively connected at one pole to a charge accumulation device and a gate of a field-effect transistor and otherwise is completely insulated from other elements of the integrated semiconductor circuit is therefore a highly precise charge measuring device.

Definitions

In this text, any electronic circuit which is formed on a semiconductor substrate is considered to be an integrated semiconductor circuit. Such a circuit can comprise different structures and circuit elements, which may be produced by means of different manufacturing processes or manufacturing technologies. Preferably, all components of the integrated semiconductor circuit are produced by means of the same technology. For example, an integrated semiconductor circuit may be one or more integrated circuits which are produced using metal-oxide semiconductor technology (MOS) or the like on a substrate.

Preferred Embodiment

In accordance with a preferred embodiment, the charge measuring device comprises a capacitor having a pole and a further pole; a field-effect transistor, which comprises a source connection, a drain connection and a gate connection, and a charge accumulation device, which are manufactured jointly in an integrated semiconductor circuit, wherein one pole of the capacitor is conductively connected to the charge accumulation device and the gate connection of the field-effect transistor, and one pole of the capacitor, the gate connection and the charge accumulation device are all insulated from further circuit elements. A method for measuring a charge quantity with the aid of an integrated semiconductor circuit, which comprises a charge measuring device, wherein the charge measuring device comprises a capacitor having a pole and a further pole, a field-effect transistor, which comprises a source connection, a drain connection and a gate connection, and a charge accumulation device, wherein one pole of the capacitor is conductively connected to the charge accumulation device and the gate connection of the field-effect transistor, and one pole of the capacitor, the gate connection of the field-effect transistor and the charge accumulation device are all insulated from further circuit elements, comprises the following steps: operating the charge measuring device in such a way that a voltage is present at the further pole of the capacitor and a drain-source current flows through the field-effect transistor, and ascertaining a relationship between the voltage at the further pole of the capacitor and the drain-source current, comparing the ascertained relationship with a previously ascertained or calculated reference relationship between the voltage present at the further pole of the capacitor and the drain-source current and deriving the change in charge quantity which is stored in the capacitor via the charge accumulation device.

If the capacitor with the charge stored thereon is considered to be a constant voltage source, this voltage which is caused by the charging of the capacitor changes that voltage which needs to be applied via the further capacitor connection in order to generate a predetermined drain-source current in the field-effect transistor.

A suitable use of the charge measuring device envisages the use of the charge measuring device for identifying an attack with a focused ion beam (FIB attack) on the integrated semiconductor circuit, in which a change in the relationship between the "gate voltage" coupled in via the further pole of the capacitor and the drain-source current is evaluated and, from this, a change which may be present in the state of charge of the capacitor with respect to a reference state is derived and a thus ascertained change in charge is identified as an attack having taken place with a beam of charged particles (for example FIB attack) or an electrical field with a high field strength.

The described apparatus and the described method are therefore suitable for precisely measuring charges in the attoampere second range. The charge measuring device can advantageously, as cited, be used for detecting present attacks or attacks that have taken place in the past (for example FIB attacks). Furthermore, however, it is also possible to pick up and precisely measure charges in other situations via the charge accumulation device. It is also important in this case that the charge accumulation device, which is conductively connected to one pole of the capacitor and to the gate of the field-effect transistor, is insulated, with the result that charges accumulated thereon can only flow away onto the capacitor and not in any other way. It goes without saying that during the charge pickup, a conductive connection to another charge-carrying element can be formed, possibly for a short period of time. It is likewise possible, however, to temporarily generate charges in the form of mirror charges on the charge accumulation device which is in the form of an antenna, for example, which likewise results in temporary charging of the capacitor. The storing of charge in the capacitor again brings about a change in the voltage required at the further connection of the capacitor, which voltage is required as "gate voltage" for the field-effect transistor in order to achieve a preset drain-source current.

It is advantageous for detection of an FIB attack to design the charge accumulation device to be in the form of an antenna structure in the integrated semiconductor circuit. The charge accumulation device is thus arranged, for example, as a conductive area adjacent to a surface of the integrated semiconductor circuit, but in the interior of the interlevel dielectric.

In a simple embodiment, the further pole of the capacitor, the drain connection and the source connection of the field-effect transistor are connected to connections of the integrated semiconductor circuit. These connections can be used to connect a driver circuit or measuring instruments for completing the charge measuring device. The charge measuring device with such a design, which is realized in the integrated semiconductor circuit, can be considered in simplified form to be a field-effect transistor, whose gate represents the further pole of the capacitor, wherein the threshold voltage of the gate is dependent on the charge stored on the capacitor.

An embodiment of the method according to the invention therefore provides that the threshold voltage of the field-effect transistor is ascertained as a relationship between the voltage present at the further pole and the drain-source current. For this, for example, a voltage-current characteristic can be plotted which can be used to ascertain in a simple manner the threshold voltage. In this case, instead of the otherwise conventional gate voltage, the voltage which is present at the further pole of the capacitor is used. A development of the charge measuring device therefore provides that the field-effect transistor is connected to a current measuring device measuring the drain-source current, and the further pole of the capacitor is connected to a voltage source, which is actuable or is actuated so that a current is measured in the current measuring device so that a relationship between the voltage present at the further pole of the capacitor and the drain-source current can be ascertained.

It goes without saying that it is likewise sufficient to ascertain a voltage which is to be applied to the further pole of the capacitor in order to produce a predetermined drain-source current of the field-effect transistor given otherwise identical operating conditions. A change in this voltage with respect to a reference voltage is linked, via the capacitance of the capacitor, directly with the charge which is stored on the capacitor. Therefore, for example, any FIB attack results in a change in charge which is measurable via a change in the voltage which is necessary to realize a predetermined drain-source current.

It has proven to be particularly advantageous to derive the voltage present at the further pole of the capacitor, by means of an amplifier, from the drain-source current flowing through the field-effect transistor. This means that the output signal of the amplifier, the voltage which is applied at the further pole of the capacitor, is coupled back into the amplifier via the capacitor and the field-effect transistor. If it is ensured that the drain-source current flowing through the field-effect transistor assumes a preset value, a voltage is set at the pole of the further capacitor, which voltage is dependent on the charge stored on the capacitor. A voltage present at the amplifier output which is coupled to the further pole is therefore a direct measure of the charge stored on the capacitor which is linked directly to a voltage, via the capacitance of the capacitor. Since this capacitance is known owing to the design of the integrated semiconductor circuit, the charge quantity or a change in the charge quantity which is stored on the capacitor can be ascertained by the resultant difference in the voltage at the further pole of the capacitor in a simple manner. In the case of sufficient amplification by the amplifier and an operation in which the amplifier is not in saturation, the voltage which is set for generating a preset drain-source current is dependent exclusively on the capacitance and the stored charge.

A preferred embodiment of the charge measuring device therefore provides that an amplifier which derives the voltage from the drain-source current flowing through the field-effect transistor is provided as the voltage source which is connected to the further pole of the capacitor.

In order to achieve a constant preset current flow through the field-effect transistor, in one embodiment it is provided that the field-effect transistor is integrated in a driver circuit, which brings about a preset setpoint drain-source current from a preset current level or preset voltage level in interaction with an amplifier fed back via the capacitor and the field-effect transistor, with the result that the voltage present at the further pole, in comparison with a reference voltage, is a measure of the change in the charge on the capacitor based on the charge stored during the reference voltage detection. For example, the field-effect transistor can be operated as a load of a current mirror, the current of which is determined by a constant current source.

In one embodiment, it is provided, for example, that the field-effect transistor and a comparison transistor, which are preferably formed identically, i.e. are matched, are arranged as loads in the two branches of a current mirror, wherein the gate voltage of the comparison transistor is derived from the current of a constant current source, and wherein the further pole of the capacitor is connected to an output of a differential amplifier, whose inputs are connected to nodes in the two current mirror branches. The nodes to which the inputs of the differential amplifier are connected are therefore, for example, either in each case the source connections of the field-effect transistor and the comparison transistor or the drain connections of the field-effect transistor and the comparison transistor depending on whether the current mirror is formed on the respective source side or on the drain side. If the current mirror is formed on the source side, i.e. the respective source connection is connected to the transistor of the current mirror, the source connections represent the nodes for the inputs of the differential amplifier.

Particularly preferred is an embodiment in which the transistors of the current mirror, the comparison transistors and the differential amplifier circuit are all formed in the same integrated semiconductor circuit and in the same manufacturing process as the field-effect transistor, the capacitance and the charge accumulation device.

In one embodiment, the comparison transistor itself is part of a further current mirror, whose mirror transistor is fed by a constant current source.

In one embodiment, it is provided that the setpoint level (for example the constant current) in the integrated semiconductor circuit is produced via a circuit built into said integrated semiconductor circuit. In such an embodiment, now only the provision of the suitable operating voltage for the integrated semiconductor circuit and the measurement of the voltage at the further pole of the capacitor are required in order to measure a change in charge on the capacitor. If such a charge measuring device is integrated in an integrated semiconductor circuit in which a further additional security-relevant circuit is implemented, the voltage level which is generated at the further pole of the capacitor during operation by means of the amplifier can be used in order to provide or not provide a security functionality. Depending on whether a change in charge with respect to a reference state has occurred which therefore points to a manipulation by means of an FIB attack, for example, the security-relevant function is implemented or not implemented. For example, the voltage level can enable or block decryption of information stored in the integrated semiconductor circuit or information stored in a memory connected thereto. With such an embodiment, it is possible to prevent, for example, a microchip from decrypting security-relevant data for a cryptographic verification step if the corresponding integrated semiconductor circuit has been subjected to an FIB attack previously and there is therefore the risk of the possibility of the security-relevant data being retrieved in unencrypted form during the decryption.

The invention will be explained in more detail below with reference to a drawing, in which:

DESCRIPTION OF THE INVENTION

Figure 1:
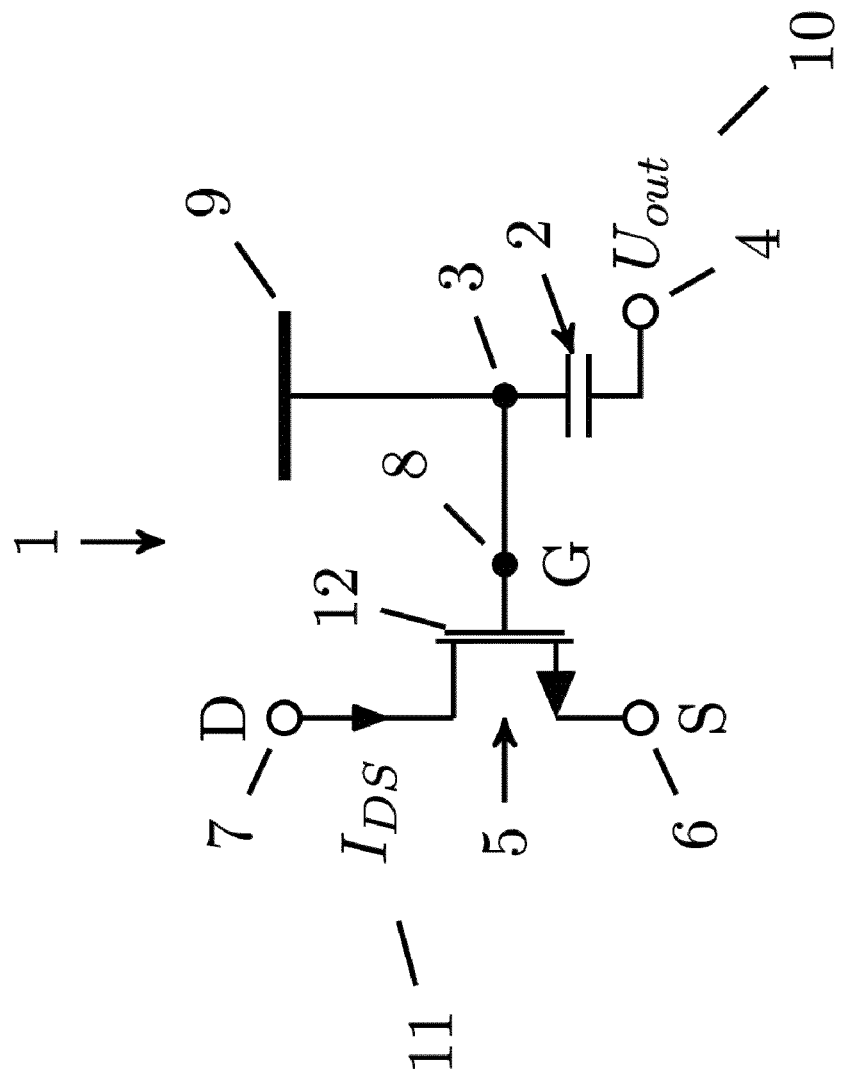
FIG. 1 shows a schematic illustration of a charge measuring device in accordance with a first embodiment.

FIG. 1 shows an embodiment of a charge measuring device 1. Such a charge measuring device comprises a capacitor 2 having a pole 3 and a further pole 4. In addition, the charge measuring device comprises a field-effect transistor 5 with a source connection 6, a drain connection 7 and a gate connection 8. In addition, the charge measuring device 1 comprises a charge accumulation device 9, which is in the form of an antenna, for example. Both the capacitor 2 and the field-effect transistor 5 and also the charge accumulation device 9 are formed jointly in an integrated semiconductor circuit. In this case, any known manufacturing technology can be used which is capable of forming field-effect transistors, capacitors and a charge accumulation device in the form of a metallic surface, for example. Preferably, the individual components, namely the capacitor 2, the field-effect transistor 5 and the charge accumulation device 9, are embodied using MOS (metal oxide semiconductor) technology or CMOS (complementary metal oxide semiconductor) technology. The field-effect transistor is in the form of a normally blocking n-type field-effect transistor on a silicon substrate, for example.

The capacitor 2 can be formed by means of a so-called PIP technology or MIM technology or between two regular metal planes or as a transistor (varactor). In this case, the capacitor electrodes using PIP technology are structures produced from polysilicon which are insulated from one another by an insulator, for example composed of so-called interpolyoxide. Interpolyoxide is similar to silicon dioxide.

In the case of MIM technology, the metallic structures are separated by an insulator. The electrodes can be produced, for example, from titanium nitride and the insulator can be produced from silicon nitride ($Si_3N_4$) or the like. Any other desired technologies can likewise be used to form the capacitor.

When using two regular metal planes as capacitor, the electrodes are realized in two different or identical metal planes. In this case, the normal intermetal dielectric is used as dielectric. A capacitor in a plane can be realized, for example, by means of finger-like electrode structures meshing with one another.

When using a transistor, the bulk or the trough is used as one electrode and the gate produced from polysilicon is used as the second electrode. The gate oxide performs the task of the dielectric. When using a transistor as capacitor, the polarity of the capacitor is critical: only the gate is highly insulated.

The charge measuring device 1 in the jointly manufactured integrated semiconductor circuit is produced in such a way that one pole 3 of the capacitor 2, the charge accumulation device 9 and the gate connection 8 of the field-effect transistor 5 are conductively connected to one another and, at the same time, are insulated from all further elements in the integrated semiconductor circuit. A decisive advantage of this embodiment consists in that all of the components of the charge measuring device 1 can be produced in the normal manufacturing process of an integrated semiconductor circuit, in which field-effect transistors, capacitors and generally also electrically conductive surfaces or conductors which can act as charge accumulation device are formed. No further process steps are required, as is required for manufacturing storage cells, for example. The charge measuring device 1 can therefore be introduced into virtually any integrated circuit which is manufactured by means of a conventional technology without any notable additional expenditure.

The charge accumulation device 9 is preferably in the form of a metallic surface, which is arranged in the interlevel insulator close to the surface of the integrated semiconductor circuit. In order to achieve sufficient insulation, the charge accumulation device 9 is completely surrounded by an insulator in a series of embodiments. In other embodiments, which are intended for an application in a vacuum, for example, the charge accumulation device 9 can be guided to the surface of the integrated circuit in order to be able to apply charges to the charge accumulation device.

In the case of the charge measuring device shown in FIG. 1, charges can be accumulated via the charge accumulation device 9 and then stored in the capacitor 2. Since one pole 3 (in the same way as the charge accumulation device 9 and the gate connection 8 or the associated gate 12 of the field-effect transistor 5) are insulated, the charge cannot "escape" without any external influence and remains on the capacitor. If the field-effect transistor 5 is now integrated in a driver circuit and the further pole 4 of the capacitor 2 is interconnected like a gate connection of the field-effect transistor 5, the field-effect transistor 5 demonstrates a different response, depending on the charge stored in the capacitor 2, in comparison with circuitry in which the gate connection 8 would be actuated directly. During operation, therefore, a relationship results between the voltage $U_{out}$ 10 present at the further pole 4 and the drain-source current $I_{DS}$ 11 of the field-effect transistor 5 which is set for this purpose. It is possible to draw a conclusion in respect of the charge stored in the capacitor 2 from the relationship between the voltage $U_{out}$ 10 present at the further pole 4 and the drain-source current $I_{DS}$ 11 flowing through the field-effect transistor 5.

In a simplified diagram, the capacitor 2 and the charge stored thereon can be regarded as a voltage source, which increases or decreases the voltage $U_{out}$ 10 present at the further pole 4 so that, for example, the threshold voltage of the field-effect transistor 5 which is intended to be applied to the further pole 4 of the capacitor 2 differs from the threshold voltage which would be applied to the gate connection 8 of the field-effect transistor 5 by the voltage which represents the charge stored on the capacitor owing to the capacitance of the capacitor.

In order to determine the charge stored on the capacitor 2, therefore, in one embodiment the field-effect transistor 5 is connected in such a way that a current flow takes place therein. The drain-source current $I_{DS}$ 11 is set in relationship with the voltage $U_{out}$ 10 present at the further pole 4 of the capacitor 2. Therefore, the charge which is stored in the capacitor 2 can be ascertained via the measurement of this voltage $U_{out}$ 10 and the drain-source current $I_{DS}$ 11. For this purpose, knowledge of the capacitance of the capacitor 2 is necessary.

In a preferred embodiment, the charge measuring device 1 is formed jointly with other circuits in a microchip in order to be used, for example, as a sensor for an FIB attack. For this purpose, the charge accumulation device 9 is designed, for example, in the form of a metallic surface close to a surface of the microchip in the interlevel insulation. Even in the case of weak ion currents which are used for scanning the microchip, positive charges accumulate on the surface of said microchip. In order to compensate for these charges, a charge transfer takes place in such a way that negative charges accumulate on the charge accumulation device 9, which acts as antenna. By virtue of this charge transfer, a voltage arises in the capacitor 2 and at the gate 12. Even in the case of very low ion currents, the voltages arising in the capacitor 2 and at the gate 12 are generally so high that they are above the tunnel threshold above which individual charge carriers can tunnel through the insulation of the gate 12 or the capacitor 2. Owing to the tunneling of the charges, the voltage present at the gate 12 or at the capacitor 2 is reduced. If the charges adhering to the surface of the microchip are neutralized, the mirror charges flow away from the charge accumulation device 9 (the antenna) again. However, the charges which have been tunneled in the capacitor 2 or at the gate 12 remain on the capacitor 2, with the result that a charge remains stored in the capacitor 2. This can also be proven after termination of the FIB attack at any time. A change in charge with respect to a reference state can therefore be determined at any time.

In general, it is also impossible to compensate for the charge transferred to the capacitor by virtue of such a tunnel operation by the application of an opposite charge equal in size on the microchip via "back-tunneling" of the charge. Although a tunnel operation in the opposite direction can cause precise compensation to be effected, this would appear to be practically impossible, however. Owing to the insulation of the charge accumulation device 9, of one pole 3 of the capacitor 2 and of the gate 12 and of the gate connection 8, a direct discharge cannot be brought about. It is thus also possible in any case to retrospectively prove such an attack even when the attack took place while the microchip was not in operation.

Figure 2:
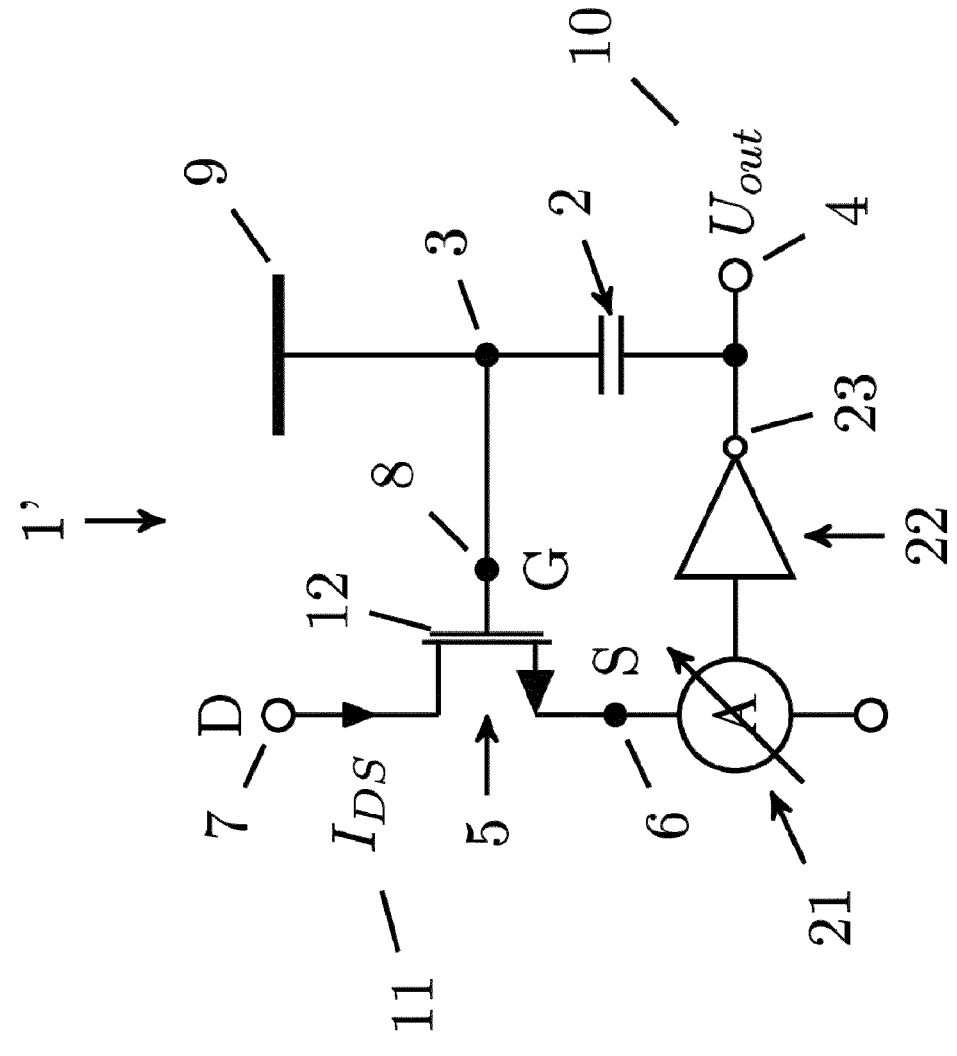
FIG. 2 shows a charge measuring device in accordance with a second embodiment.

FIG. 2 shows a further embodiment of a charge measuring device 1'. Identical technical features are identified by the same reference symbols and, when not described otherwise, have an identical or the same design as the features and components described in relation to other figures. In the embodiment illustrated in FIG. 2, the source connection 6 of the field-effect transistor 5 is connected in series with a current measuring or current regulating device 21.

A current measuring/current regulating device 21 is in this case understood to mean an apparatus which either determines a current flowing through said current measuring/current regulating device or seeks to bring about a determined current flow through said current measuring/current regulating device.

In addition, the charge measuring device 1' has an amplifier 22, whose output 23 is conductively connected to the further pole 4 of the capacitor 2. Depending on the drain-source current $I_{DS}$ 11 flowing in the current measuring/current regulating device 21, the voltage present at the further pole 4 of the capacitor 2 is derived by means of the amplifier 22. When considered otherwise, the amplifier is coupled-back via the capacitor 2 and the field-effect transistor 5. If the current measuring/current regulating device 21 is operated in such a way that a preset drain-source current $I_{DS}$ 11 flows through the field-effect transistor 5, the voltage $U_{out}$ 10 derived from this drain-source current $I_{DS}$ 11 via the amplifier 22 at the further pole 4 of the capacitor 2 indicates the relationship between the voltage $U_{out}$ 10 and the drain-source current $I_{DS}$ 11 directly. Therefore, $U_{out}$ 10, the voltage present at the further pole 4 of the capacitor 2, is a direct measure of the charge stored on the capacitor 2. This applies whenever the amplifier 22 is not being operated at saturation and when the gain of said amplifier is sufficiently great, as is the case, for example, in conventional operational amplifiers. The voltage $U_{out}$ 10 which is set is, in the case of a preset drain-source current $I_{DS}$ 11, preset by the capacitance 2 and the charge stored thereon. In the case of knowledge of the capacitance of the capacitor 2, the charge or the change in charge with respect to a reference state which is stored on the capacitor 2 can be calculated in relation to a reference voltage $U_{out,Ref}$.

Figure 3:
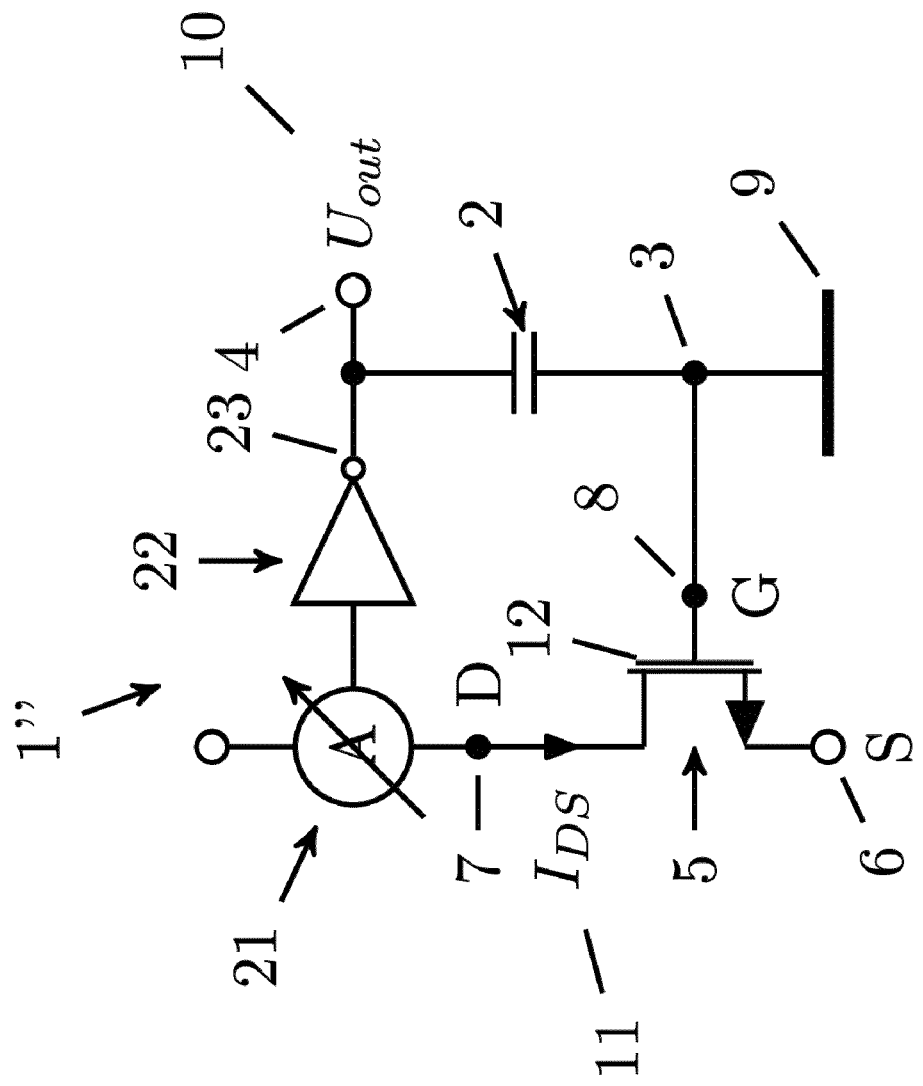
FIG. 3 shows a further embodiment of a charge measuring device.

FIG. 3 shows, schematically, a further embodiment of a charge measuring device 1'' which is similar to that shown in FIG. 2. The embodiment shown in FIG. 3 differs from that shown in FIG. 2 in that the current measuring/current regulating device 21 is not arranged in the source branch, but in the drain branch of the circuit. This means that the drain connection 7 is connected to the current measuring/current regulating device 21. Otherwise, the mode of operation of the charge measuring device 1'' is analogous to that shown in FIG. 2.

The amplifier 22 and the current measuring/current regulating device 21 can each be embodied externally or entirely or partially within the semiconductor circuit in which the field-effect transistor 5, the capacitor 2 and the charge accumulation device 9 are also formed.

Figure 4:
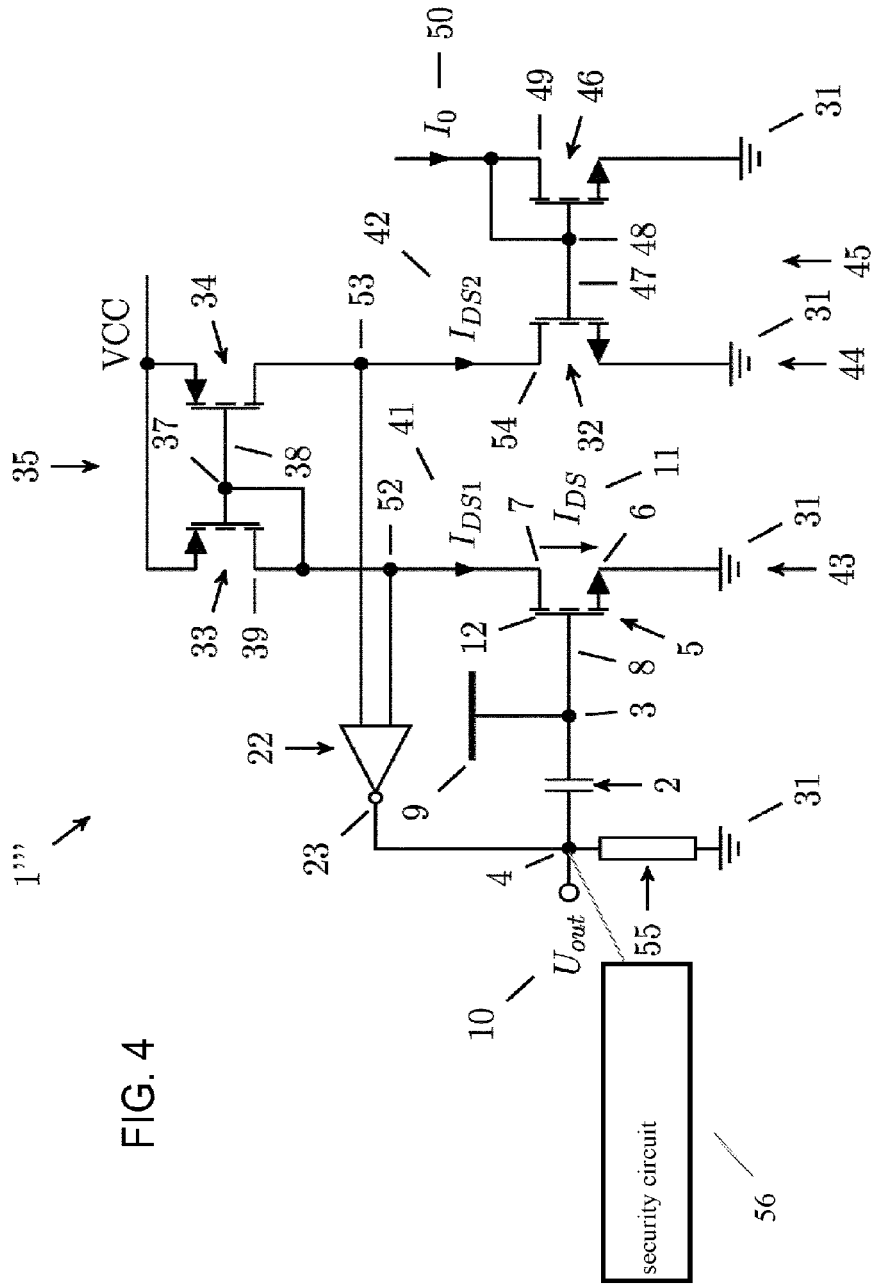
FIG. 4 shows yet a further embodiment of a charge measuring device.

FIG. 4 shows schematically, by way of example, possible circuitry. The source connection 6 of the field-effect transistor 5 of the charge measuring device is connected to ground 31. The gate connection 8 is connected to one pole 3 of the capacitor 2 and the charge accumulation device 9, in the form of an antenna. The gate 12 of the field-effect transistor 5, one pole 3 of the capacitor and the charge measuring device 1 are insulated with respect to other components of the integrated circuit.

The field-effect transistor 5 and an identically designed, matched comparison transistor 32 are each arranged as load in a current mirror 35 formed by two field-effect transistors, denoted as mirror transistors 33, 34. Gate connections 37, 38 of the mirror transistors 33 and 34 are each at the same potential, which is derived from the potential present at the drain connection 39 of one mirror transistor 33. This ensures that the drain-source current $I_{DS1}$ 41 through one mirror transistor 33 and one branch 43 of the current mirror 35 is equal to the drain-source current $I_{DS2}$ 42 through the other mirror transistor 34 and the other branch 44.

The comparison transistor 32 is part of a further current mirror 45 together with a field-effect transistor, denoted here as coupling-in transistor 46. A gate connection 47 of the comparison transistor 32 and a gate connection 48 of the coupling-in transistor 46 are conductively connected to one another, wherein the potential thereof is derived from that of the drain connection 49 of the coupling-in transistor 46. The coupling-in transistor 46 is fed a preset constant current $I_0$ 50. This predetermines that a current of the same magnitude as the constant current $I_0$ flows through the comparison transistor 32, through which the mirror current $I_{DS2}$ 42 flows as well. Therefore, $I_{DS2}$ is equal to $I_0$. Owing to the current mirror 35, the same applies to the mirror current $I_{DS1}$ 41, which is kept identical to the mirror current $I_{DS2}$ 42 by virtue of the current mirror 35. Therefore, the drain-source current $I_{DS}$ 11 which flows through the field-effect transistor 5 is determined and specified by the constant current $I_0$. In order to achieve this current flow through the field-effect transistor 5, it is necessary for a corresponding potential to be applied to the further pole 4 of the capacitor 2, which potential together with the possibly stored charge on the capacitor 2, as described above, then produces a corresponding gate voltage at the gate connection 8.

The voltage $U_{out}$ 10 at the further pole 4 is produced by means of an amplifier 22 in the form of an operational amplifier, for example, the output 23 of said amplifier being connected to the further pole 4 of the capacitor 2. In this embodiment, the amplifier 22 is in the form of a differential amplifier and is actuated by the voltage drops across the field-effect transistor 5 and the comparison transistor 32 at the node 52, which corresponds to the drain connection 7 of the field-effect transistor 5, and at the node 53, which corresponds to the drain connection 54 of the comparison transistor 32. If the transistor 32 is matched optimally to the field-effect transistor 5, there is the same voltage drop across both transistors when the same current flows through the two transistors. This is brought about by virtue of the current mirror 35 if the operational amplifier produces a suitable voltage at its output 23. In the case of a sufficiently high gain of the amplifier 22 and in the case of operation in which the amplifier 22 is not at saturation, the suitable voltage $U_{out}$ 10 is set at the output, and this voltage is only dependent on the capacitance of the capacitor 2 and the charge stored thereon. The voltage $U_{out}$ 10 at the further pole 4 of the capacitor 2 which forms a voltage drop across the resistor 55 is a measure of the charge stored on the capacitor 2, as already explained above. Since an amplifier provides a low-resistance output, the voltage $U_{out}$ 10 can be measured without the circuit being influenced notably. Thus, precise measurement of the voltage $U_{out}$ 10 and, by virtue of this, the charge stored on the capacitor 2 is possible, wherein the capacitance of the capacitor 2 is included in the calculation of the precise charge.

The embodiment described in accordance with FIG. 4 represents exemplary circuitry. The constant current used in the circuit can also be formed via suitable circuits in the integrated circuit in which the other elements of the charge measuring device 1''' are formed.

The described charge measuring devices can be used in a suitable manner for identifying an FIB attack on such an integrated circuit by virtue of the charge accumulation device 9, in the form of an antenna, being arranged at a suitable location close to the surface, for example the rear side of the integrated semiconductor circuit, i.e. above the components formed on the semiconductor substrate. It is likewise possible to evaluate the voltage level which is set at the further pole 4 in a further security circuit 56 and to perform, for example, decryption of cryptographically encrypted data only when the voltage level $U_{out}$ 10 which is set during operation corresponds to the reference voltage level which was measured in the finished charge measuring device 1''' prior to an attack. This provides the advantage that, for example, after an FIB attack in which a node has become exposed at which the decrypted data could be tapped off, this attack is identified and decryption suppressed, with the result that no decrypted data can be read from the manipulated microchip, represented by the semiconductor circuit. The relationship between the voltage at the further pole 4 of the capacitor 2 and the drain-source current $I_{DS}$ 11 is therefore evaluated in the security circuit 56.

It is obvious to the person skilled in the art that only exemplary configurations are specified here. The field-effect transistor whose gate is connected to one pole of the capacitor and of the charge accumulation device can be formed as an n-conducting or p-conducting depletion-mode or enhancement-mode transistor. The configuration of the amplifier is not described in more detail here. However, various configurations are well known to a person skilled in the art. In addition, a current regulating device is described here. However, it is also possible for other current regulating devices or current measuring devices to be used in order to measure the drain-source current through the transistor or to set it to a preset level in order to set the voltage present at the further pole 4 in relationship therewith.

LIST OF REFERENCE SYMBOLS 1 charge measuring device
2 capacitor
3 one pole of capacitor
4 further pole of capacitor
5 field-effect transistor
6 source connection
7 drain connection
8 gate connection
9 charge accumulation device
10 $U_{out}$
11 drain-source current $I_{DS}$
12 gate
21 current measuring/current regulating device
22 amplifier
23 output
31 ground
32 comparison transistor
33 mirror transistor
34 mirror transistor (other)
35 current mirror
37 gate connection of one mirror transistor (33)
38 gate connection of other mirror transistor (34)
39 drain connection of one mirror transistor (33)
41 first drain-source current $I_{DS1}$
42 second drain-source current $I_{DS2}$
43 one branch
44 another branch
45 further current mirror
46 coupling-in transistor
47 gate connection of comparison transistor (32)
48 gate connection of coupling-in transistor (46)
49 drain connection of coupling-in transistor (46)
50 constant current $I_0$
52 node (equivalent to drain connection 7 of field-effect transistor 5)
53 node (equivalent to drain connection 54 of comparison transistor 32)
54 drain connection of comparison transistor (32)
55 resistor

The invention claimed is:

1. A charge measuring device, comprising:
   a capacitor having a first pole and a second pole;
   a field-effect transistor having a source connection, a drain connection and a gate connection;
   a charge accumulation device, and
   an amplifier coupled back via said capacitor and said field-effect transistor to obtain a preset setpoint drain-source current, with a result that a voltage present at said second pole, in comparison with a reference voltage, is a measure for a change in a charge on said capacitor based on a charge stored during a reference voltage detection;
   wherein said capacitor, said field-effect transistor and said charge accumulation device are manufactured jointly in an integrated semiconductor circuit;
   wherein said first pole of said capacitor is conductively connected to said charge accumulation device and to said gate connection of said field-effect transistor; and
   wherein said first pole of said capacitor, said gate connection and said charge accumulation device are all insulated from further circuit elements.

2. The charge measuring device according to claim 1, wherein said field-effect transistor is connected to a current measuring device measuring a drain-source current or a current regulating device determining the drain-source current, and said second pole of said capacitor is connected to a voltage source, which is actuable or is actuated such that a current is measured it said current measuring device or a current is preset by said current regulating device so that a relationship between a voltage present at said second pole of said capacitor and said drain-source current can be ascertained.

3. The charge measuring device according to claim 2, wherein said voltage source comprises an amplifier, which derives the voltage from the drain-source current flowing through said field-effect transistor.

4. The charge measuring device according to claim 1, wherein said second pole of said capacitor is coupled to a security circuit on the integrated semiconductor circuit, said security circuit is configured to selectively implement or not implement a security function during operation in which the voltage is provided at said second pole by an amplifier which is coupled back via said capacitor and said field-effect transistor, depending on the voltage.

5. The charge measuring device according to claim 1, wherein a relationship between the voltage coupled in via the second pole of the capacitor and the drain-source current is changed due to a beam of charged particles or an electrical field with a high field strength being applied to the integrated semiconductor circuit.

6. The charge measuring device according to claim 1, wherein said capacitor, said field-effect transistor and said charge accumulation device are embodied using metal oxide semiconductor technology or complementary metal oxide semiconductor technology.

7. A method for measuring a charge quantity with an integrated semiconductor circuit having a charge measuring device, the method comprising:
   providing a charge measuring device, including:
   a capacitor having a first pole and a second pole, a field-effect transistor having a source connection, a drain connection and a gate connection, a charge accumulation device, and an amplifier coupled back via the capacitor and the field-effect transistor to obtain a preset setpoint drain-source current, with a result that a voltage present at the second pole, in comparison with a reference voltage, is a measure for a change in a charge on the capacitor based on a charge stored during a reference voltage detection, wherein the capacitor, the field-effect transistor and the charge accumulation device are manufactured jointly in an integrated semiconductor circuit, wherein the first pole of the capacitor is conductively connected to the charge accumulation device and to the gate connection of the field-effect transistor, and wherein the first pole of the capacitor, the gate connection and the charge accumulation device are all insulated from further circuit elements;

operating the charge measuring device in such a way that a voltage is present at the second pole of the capacitor and a drain-source current flows through the field-effect transistor, and ascertaining with the charge measuring device a relationship between the voltage at the second pole of the capacitor and the drain-source current;

comparing the relationship with a previously ascertained or calculated reference relationship between the voltage present at the second pole of the capacitor and the drain-source current and deriving a change in charge quantity stored in the capacitor via the charge accumulation device.

8. The method according to claim 7, which comprises deriving, with an amplifier, the voltage present at the second pole of the capacitor from a current flowing through the field-effect transistor.

9. The method according to claim 7, which comprises identifying an effect resulting from a beam of charged particles or as a result of an electrical field with a high field strength on the integrated semiconductor circuit by evaluating the change in the relationship between the voltage coupled in via the second pole of the capacitor and the drain-source current and identifying the change in charge thus ascertained as an effect caused by a beam of charged particles or an effect of an electrical field with a high field strength.

10. The method according to claim 7, wherein said capacitor, said field-effect transistor and said charge accumulation device are embodied using metal oxide semiconductor technology or complementary metal oxide semiconductor technology.

* * * * *